US006606722B1

United States Patent
Haimi-Cohen

(10) Patent No.: US 6,606,722 B1
(45) Date of Patent: Aug. 12, 2003

(54) METHODS AND APPARATUS FOR PROVIDING TRANSPARENT ERROR CORRECTION FOR WIRELESS BAUDOT COMMUNICATIONS

(75) Inventor: R. Haimi-Cohen, Springfield, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/550,463

(22) Filed: Apr. 17, 2000

(51) Int. Cl.[7] .............................................. H03M 13/05
(52) U.S. Cl. ....................................... 714/746; 714/776
(58) Field of Search .................................. 714/746, 776

(56) References Cited

U.S. PATENT DOCUMENTS

| | | | | |
|---|---|---|---|---|
| 3,613,078 A | * | 10/1971 | Manning et al. ............. | 714/800 |
| 5,136,290 A | * | 8/1992 | Bond et al. ................... | 341/67 |
| 5,724,405 A | * | 3/1998 | Engelke et al. ............... | 379/52 |
| 6,351,495 B1 | * | 2/2002 | Tarraf ........................... | 375/259 |

* cited by examiner

Primary Examiner—Stephen M. Baker

(57) ABSTRACT

An error-correcting Baudot communication system which employs error correction which is transparent to systems not employing corresponding error correction. When a transmitter receives Baudot input to be transmitted, it creates a message specifying the format and content of the Baudot message and formats the message as a bad frame packet. The message is then followed by a stream of Baudot characters representing the input. The message, followed by the stream of Baudot characters, is transmitted to a receiver. An error-correcting receiver detects and decodes the message and passes the data represented by the message to a user device. When the message is received at a receiver which does not employ this error correction system, the message will be rejected as a bad frame and the stream of Baudot characters which follows the message will be decoded.

25 Claims, 9 Drawing Sheets

METHODS AND APPARATUS FOR PROVIDING TRANSPARENT ERROR CORRECTION FOR WIRELESS BAUDOT COMMUNICATIONS

FIELD OF THE INVENTION

The present invention relates generally to improvements in digital wireless telephony. More particularly, the invention relates to advantageous aspects of receivers and transmitters operative to detect and correct errors found in Baudot-encoded text telephony signals in a digital wireless telephony system.

BACKGROUND OF THE INVENTION

Text telephony (TTY) is a technique developed to aid communication by persons who have difficulty using ordinary telephone equipment, typically because of difficulties with speech or hearing. Communication is accomplished by transmitting text messages over the telephone network, using special equipment to allow generation, transmission and display of text. The typical text telephony connection allows the choice of two-way text communication, or the use of voice communication by one party and text communication by the other.

TTY requires special terminal devices on both ends of the telephone line. One possible device is a teletype, which consists of a keyboard and a display, sometimes also including a printer. The teletype is connected to a telephone set via an acoustic coupler or an RJ11 connector. Some teletypes are portable and lightweight, sometimes weighing less than a pound, and are well suited to work with mobile terminals. Another suitable device is an integrated teletype and telephone, which can perform both voice and text telephony. An additional existing device is a TTY modem which converts a personal computer (PC) into a TTY device. This modem serves as an interface between the PC and the telephone line, and allows the PC to operate as a TTY device. In particular, it performs encoding and decoding between ASCII character streams and TTY signals. A further device is an analog cellular phone adapter. This device is a brand and model specific adapter which connects the RJ11 port on a teletype to a connection in a digital cellular phone.

In text telephony, the text messages are usually encoded using frequency shift key (FSK) modulation, and are transmitted over the telephone line and decoded at a receiver. TTY signals are transparent to the telephone network and are treated like any other audio signal.

Several coding schemes are available for use with TTY. The most common is Baudot coding, which is supported as a default by all or almost all TTY terminals.

TTY techniques are well developed in the context of conventional wire telephony. Wireless telephony, however, presents at least two significant issues which must be addressed if TTY is to be successful. One issue is the distortion to the TTY signals caused by the wireless channel, and a second issue is the need to provide an interface between the cellular phone and a TTY terminal. These issues have been satisfactorily dealt with in the case of analog phones. A number of manufacturers offer TTY interface gear for use between the cellular phone handset and an RJ11 port of a teletype unit. In addition, distortion caused by analog wireless communication is generally acceptable for transmission of Baudot coded messages.

Digital wireless communication provides numerous advantages for voice communication. However, prior-art digital wireless communication has not proven to be well suited for TTY communication, because the FSK coding is very sensitive to the channel distortion in digital wireless systems, to the point that practical TTY communication is prevented. There are two causes for this problem. In commonly used speech coders used in systems following the IS-136 standard (which employs time division multiple access, or TDMA), source coding distortion is introduced into the Baudot coding process. The speech coders in question are IS-641 and VSELP. The coders used in IS-136 have a bit rate of 8 kb/sec, in contrast to the US-1 coder used in GSM-NA (PCS1900) or the QCELP13 coder of IS-95 (which employs code division multiple access, or CDMA), which provide bit rates of 12–13 kb/sec, and produce significantly less source coding distortion. The IS-136 coder is sufficiently widely used that it will continue to be encountered as part of the communications infrastructure, and therefore any TTY communications system must be able to deal with source code distortions produced by IS-136 systems. On the other hand, the channel error rate in the IS-95 protocol usually precludes useful TTY communication.

Improved communication is possible if methods of error detection and correction can be introduced into communication using Baudot coding. This may be advantageously done by adding control information to message information. Commonly used error correction protocols used in other contexts include, for example, the use of cyclic redundancy code (CRC) information which is added to message data by a transmitter and then used by a receiver to check the correctness of the received message.

A large base of equipment presently exists for the use of Baudot coding to transmit TTY messages. The need for compatibility with this equipment base presents a significant obstacle for the use of error correcting codes. Wireless telephones are typically used to communicate with many different telephones without regard to type. A digital wireless telephone which employed Baudot coding would be expected to communicate with any number of other devices, whether these devices were digital wireless, analog wireless, or wireline devices. In error correction systems of the prior art, error correction systems typically require coordination between the transmitter and the receiver. If a transmitter includes error correction code in the transmitted message, the receiver must expect this code in the received message. If error correction code is present in the transmitted message, but is not expected by the receiver, this code will likely be interpreted as data and produce corrupted results. Similarly, if the receiver expects to find error correction code in the received message, but the transmitter does not supply this code, data bits in the received message will be incorrectly interpreted as error correction code and will produce faulty results.

Wireline and analog wireless TTY devices are much less susceptible to errors and distortion than are digital wireless devices. This robustness of operation suggests that error correction systems are likely to remain a low priority to manufacturers of wireline and analog wireless devices, and there will continue to be a large installed base of TTY devices which do not include error correction systems.

Because of the large base of installed equipment, and the likelihood that new equipment which lacks error correction features will continue to be installed, it is important that any TTY device which includes error correction should be able to communicate successfully with equipment which lacks error correction.

The Baudot code is a half duplex code using characters made up of bits represented by designated frequencies, each bit being 22.0±0.4 msec long. A "1" (MARK) is represented by a frequency of 1400 Hz while a "0" (SPACE) is represented by a frequency of 1800 Hz. A transmitted character includes a start bit (0), five data bits, and one stop bit (1). The duration of the stop bit can be anywhere between a normal bit duration to two normal bits duration. If no other character is transmitted immediately after the current character, then the stop bit may be extended by a "MARK hold time" which may be anywhere from 0 to 300 msec.

As noted above, the stop bit in a Baudot character may be of any length from 1 to 2 bits. This gives the stop bit a time duration which may vary anywhere from 22 to 44 msec. This variation in duration provides an opportunity for insertion of non-data information, such as control information.

In Baudot communication, the data rate is at most 32 bits per second. The Baudot code rate is 45 bits per second including a start bit and a stop bit, corresponding to about 6 characters per second. In reality, the rate at which data is transmitted is much lower due to human typing speed limitations. Therefore, even with faster code and more bits per character, a data rate of more than 50 bits per second will not be expected.

In all wireless standards, a full rate speech packet provides at least 100 error protected bits (class 1a and 1b) of which at least 50 are also protected by CRC. This represents a data capacity significantly greater than required to transmit Baudot signals. Some of this excess capacity is therefore available to be adapted for use in error correction. Bits can be "stolen" from data transmission in order to serve as error correction codes, without a meaningful reduction in data transmission rates. These "stolen" bits, if appropriately handled, may advantageously be designated so that they will not be misinterpreted as data bits by receivers not having error correction capability, but will instead be ignored or skipped over.

There exists, therefore, a need in the art for methods and apparatus for error correction in Baudot code communication equipment, which employs error correction which is transparent to equipment with no error correction capability, and which employs data bits in excess of those needed to convey data at a maximum practical rate, in order to convey information needed for error correction.

SUMMARY OF THE INVENTION

In one aspect, a Baudot capable communication system according to the present invention holds Baudot characters in a buffer until either a predetermined number of characters enters the buffer or a predetermined time elapses. Once one of these conditions occurs, the characters are passed to a character packer. The character packer generates a message identifying the buffer contents as a Baudot message and specifying the characters comprising the message. The message will be assigned a CRC with each bit toggled so that the message appears as a bad frame. The duration of the message will be selected within a silence segment or within a stop bit of length 2, so that the loss of a frame will have little impact. After the message is created, the Baudot encoder will then generate the waveforms of the Baudot characters and feed them to a speech encoder for transmission.

If the message is received at a receiver which is not capable of interpreting the error correcting data, the message will appear as encoded frames of silence followed by a single bad frame, followed by the Baudot signal, which will be regenerated as would any other Baudot signal. The bad frame would appear in the midst of silence and would not affect the received message. If, however, the message is received at a receiver having error correction capability according to the present invention, the bad frame will be properly interpreted and the error correcting data in the frame will be read and properly employed.

In another aspect, error identification and correction information is embedded in stop bits of Baudot characters. A stop bit may be adapted to include odd or even parity information, or may alternatively include error correction information. A transmitter according to the present invention may add a stop bit having error correction information to each character transmitted. If a character is received at a conventional receiver, the stop bit will appear and will be interpreted as an ordinary stop bit. However, if a character is received at a receiver according to the present invention, the receiver will correctly interpret error correction information contained in the stop bit.

A more complete understanding of the present invention, as well as further features and advantages of the invention, will be apparent from the following Detailed Description and the accompanying drawings.

DETAILED DESCRIPTION

Figure 1:
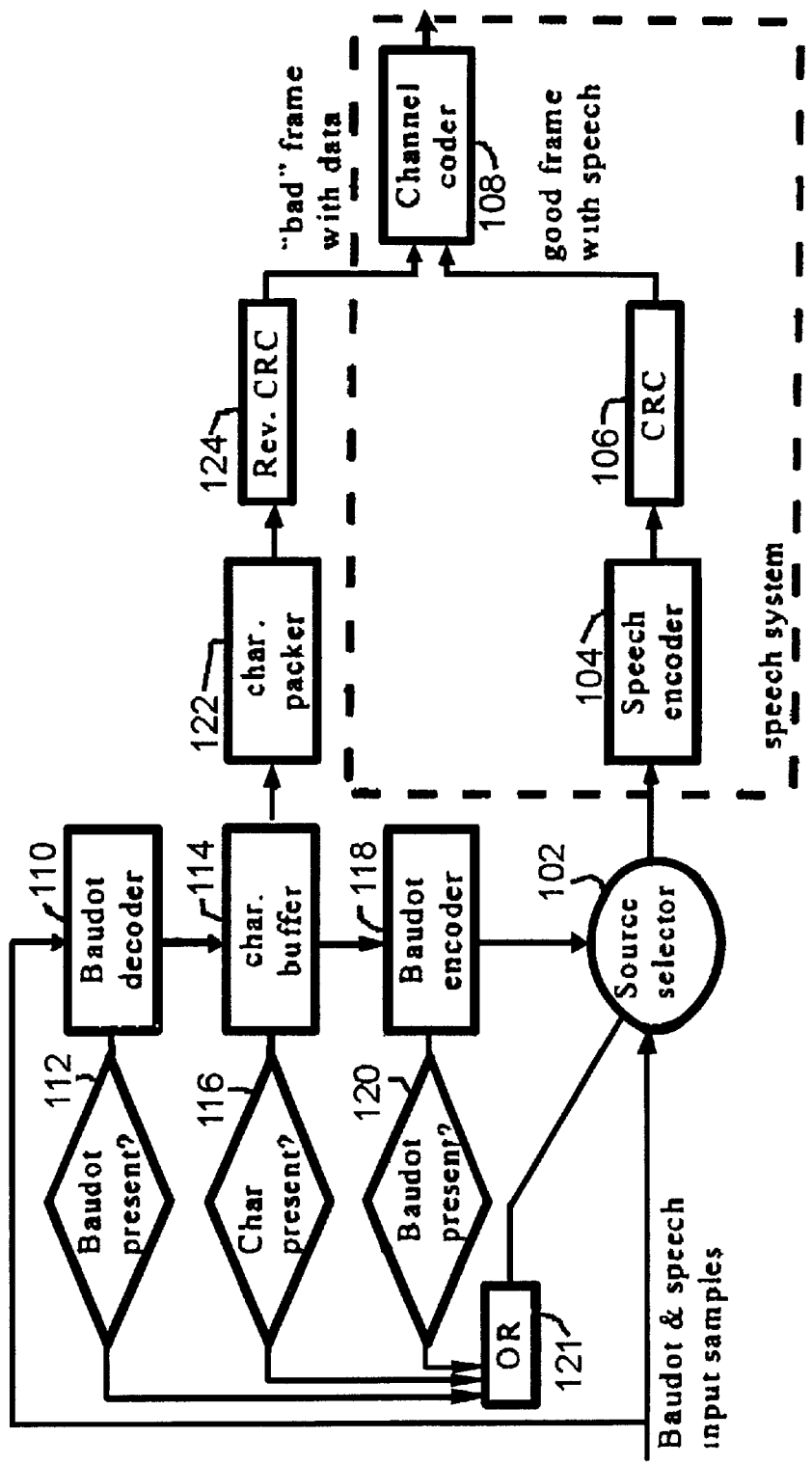
FIG. 1 illustrates a Baudot-capable error correcting transmitter according to the present invention.

FIG. 1 illustrates a Baudot-capable error correcting transmitter 100 according to the present invention. The transmitter 100 includes a source selector 102, a speech encoder 104, a cyclic redundancy code (CRC) generator 106 and a channel coder 108. During operation of the transmitter 100, an input stream comprising speech and data samples is provided to the source selector 102. During normal speech, the source selector selects the speech samples as input to the speech encoder 104. The CRC generator 106 adds CRC code to the output of the speech encoder 104 to produce a speech frame, which is then passed to the channel coder 108 to be transmitted as output.

The Baudot and speech samples appearing at the input of the transmitter 100 are also passed to a Baudot decoder 110. When Baudot signals appear at the input of the transmitter 100, they are detected by the Baudot decoder 110, which sets a first Baudot present flag 112. The transmitter 100 also includes a character buffer 114, which sets a character present flag 116 if characters are present in the buffer. The transmitter 100 further includes a Baudot encoder 118 which sets a second Baudot present flag 120 if the Baudot encoder 118 is receiving Baudot signals.

The states of the flags 112, 116 and 120 are fed to an OR gate 121, whose output is supplied as a control to the source selector 102. If any of the flags 112, 116 or 120 is set, the source selector 102 feeds the output of the Baudot encoder 118 into the speech encoder 104. When Baudot code first appears at the input to the transmitter 100, the first Baudot flag 112 is set, but at this point the Baudot encoder 118 has not received any characters. The Baudot encoder 118 therefore generates silence, which is fed to the speech encoder 104. As Baudot characters are received, they are decoded by the Baudot decoder 110 to produce a character stream, which is fed to the character buffer 114. The character buffer 114 holds the characters until one of the following two conditions is satisfied. Either the total number of characters reaches a threshold, or the time since the first character was received in the character buffer 114 reaches a threshold. Once one of these conditions occurs, the character buffer 114 transmits the characters first to a character packer 122 and then to the Baudot encoder 118. Upon receiving the character stream, the character packer 122 generates a message of the type "The next n frames will include the m Baudot characters ABC", where n is the number of frames needed to transmit the contents of the buffer 114 and m is the number of characters in the buffer 114. The message is passed to a reverse CRC generator 124, which adds a reverse CRC code to the message and then toggles all the CRC bits, thus creating a "reverse CRC". The message is then passed to the channel coder 108. Because each bit of the reverse CRC code is toggled, the message as passed by the channel coder 108 will appear as a bad frame packet according to the CRC standard. The bad frame occurs either during the silence preceding the characters or during the second half of a stop bit of length 2 of the preceding characters, and therefore the presence of the frame will have little impact on communication with a prior-art receiver incapable of interpreting the message.

Immediately after the bad frame packet is transmitted, the Baudot encoder 118 will generate a waveform representing the Baudot characters received from the character buffer 114. The waveform will then be passed to the speech encoder 104, which will encode the waveform and pass it to the CRC generator 106, which will add CRC code. The encoded waveform will then be passed to the channel coder 108 for transmission.

While the transmission of the reverse CRC frame and the subsequent frames take place, the Baudot decoder 110 continues to decode Baudot characters and load them into the character buffer 114. The characters are accumulated and then transmited when the current frame transmission is completed.

When no more Baudot characters are received at Baudot decoder 110, the first Baudot present flag 112 will be cleared. When no more characters are present in the character buffer 114, the character present flag 116 will be cleared, and when no Baudot characters are present at the Baudot encoder 118, the second Baudot present flag 120 will be cleared. Thus, all three flags are cleared when the Baudot encoder 118 has finished processing all of the characters presented, the character buffer 114 is empty and the Baudot 110 decoder does not detect any more Baudot input. At that time, the source selector 102 selects the input to the transmitter 100 and passes it to the speech encoder 104.

Figure 2:
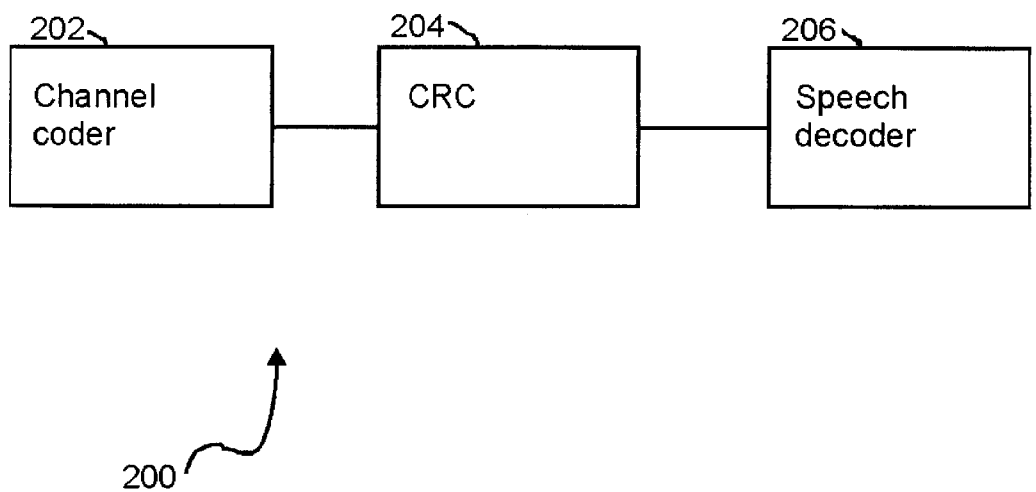
FIG. 2 illustrates a prior-art Baudot-capable receiver.

FIG. 2 illustrates a Baudot-capable receiver 200 of the prior art. The receiver 200 includes a channel coder 202, CRC detector 204 and speech decoder 206. If the receiver 200 receives a Baudot signal from a transmitter such as the transmitter 100 of FIG. 1, the signal will be decoded by the speech decoder 206 as silence followed by a single bad frame followed by the Baudot signal. As addressed above, the bad frame will represent the message "The next n frames will include the n Baudot characters ABC . . . ". The frame will appear as bad because it will have a reverse CRC added by the reverse CRC generator 124. The speech decoder 206 does not distinguish between Baudot and speech signals, and decodes all inputs according to the same speech coding algorithms. Bad frames are decoded using error concealment strategies, which essentially repeat the previous frame. Consequently, the bad frame would be decoded as silence or as a part of the stop bit of the previous character.

Figure 3:
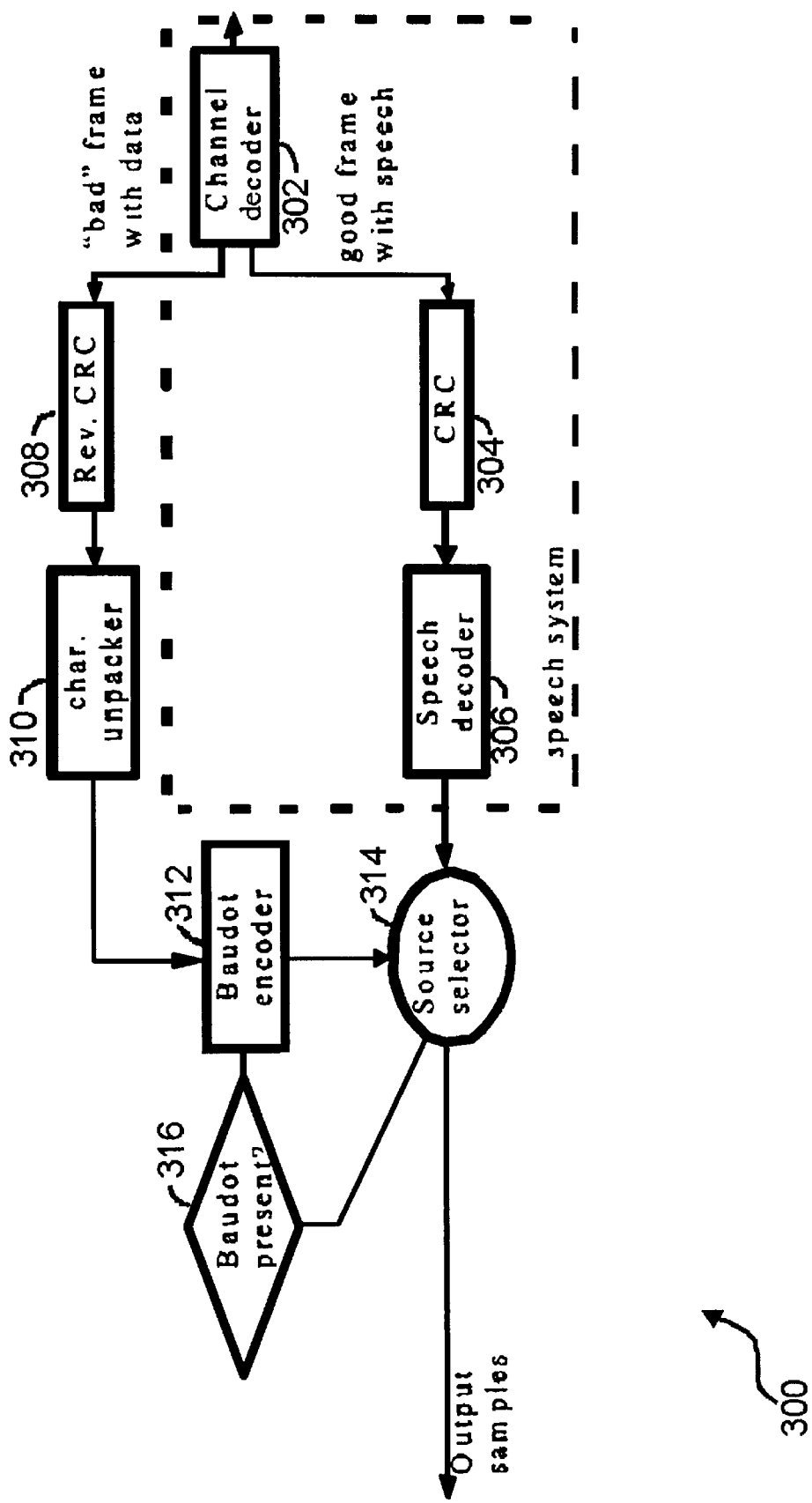
FIG. 3 illustrates a Baudot-capable error correcting receiver according to the present invention.

FIG. 3 illustrates a Baudot-capable error correcting receiver 300 according to the present invention. The receiver 300 includes a channel decoder 302, CRC decoder 304 and speech decoder 306, as well as a reverse CRC decoder 308, character unpacker 310, Baudot encoder 312, source selector 314 and Baudot present flag 316. The Baudot present flag 316 is supplied as a control to the source selector 314. When the receiver 300 receives a Baudot input from a transmitter such as the transmitter 100 of FIG. 1, input will be received at the channel decoder 302 and simultaneously passed to the CRC decoder 304 and the reverse CRC decoder 308. The reverse CRC decoder 308 will detect the reversed CRC in the bad frame packet preceding the Baudot signal and the character unpacker 310 will extract the characters from the bad frame packet and feed them into the Baudot encoder 312. Upon receiving the characters, the Baudot encoder 312 will set the Baudot present flag. The Baudot encoder 312 will convert the characters into a Baudot signal and pass it to the source selector 314. During the time in which the Baudot encoder 312 generates the signal, the Baudot present flag 316 will remain set, causing the source selector 314 to ignore the output of the speech decoder 306 and pass the output of the Baudot encoder 312. As a result, any distortion caused by bad frames, speech coding and the like will be eliminated. The CRC decoder 304 and the speech decoder 306 will also be producing a signal, but this signal will be ignored by the source selector 314. Once the Baudot generation is finished and the Baudot encoder 312 is not receiving any more characters, the Baudot encoder 312 will clear the Baudot present flag 316 and the source selector 314 will select the output of the speech decoder 306 as the output of the receiver 300.

If the receiver 300 receives a Baudot signal from a prior-art Baudot transmitter, the Baudot signal will be passed to the CRC decoder 304 and the reverse CRC decoder 308. In this case, no reverse CRC will be present and therefore the character unpacker 310 will not pass a message to the Baudot encoder 312. Therefore, the source selector 314 will pass the output of the speech decoder 306 as the output of the receiver 300.

Figure 4:
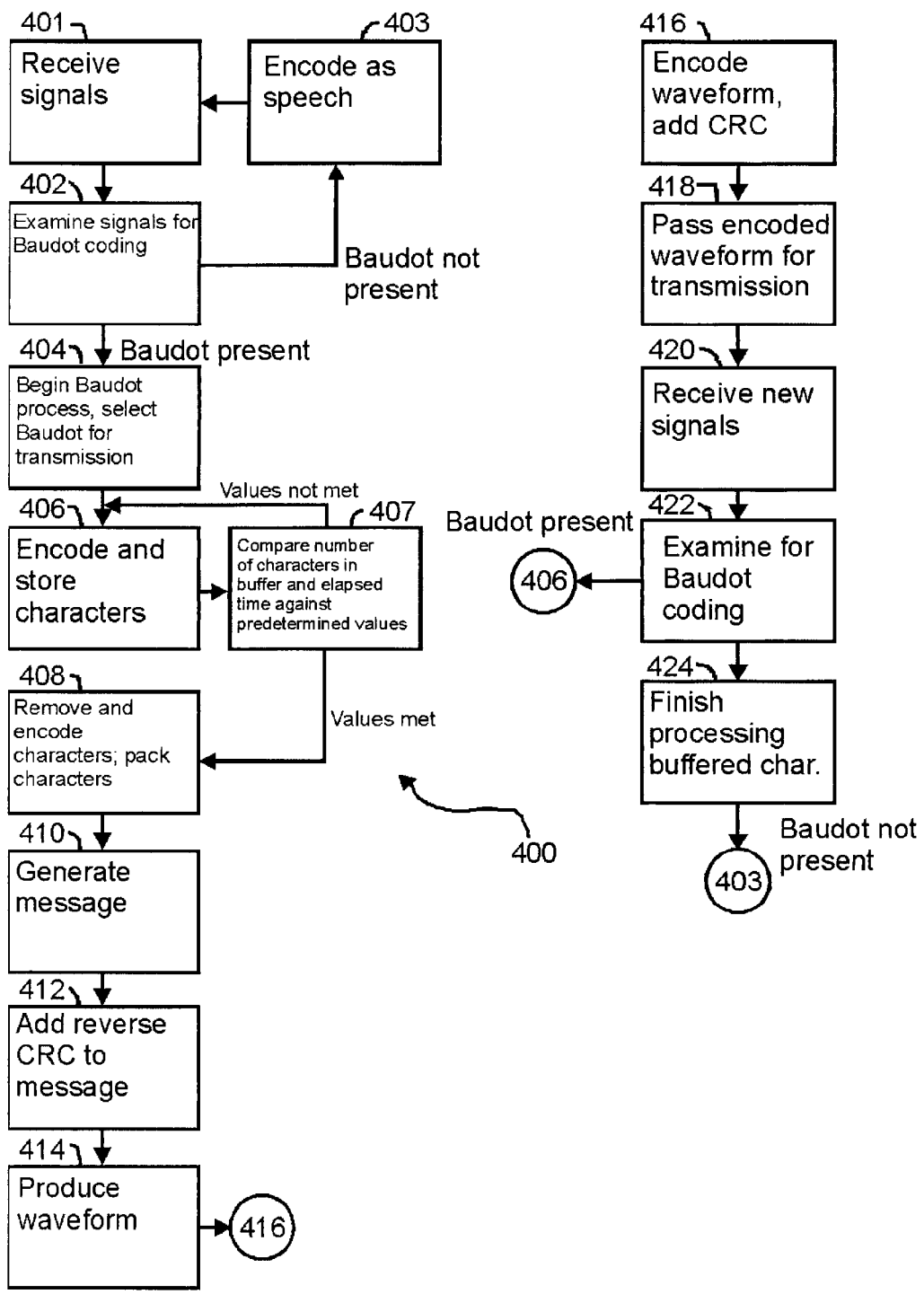
FIG. 4 illustrates a method of Baudot-capable error correcting transmission according to the present invention.

FIG. 4 illustrates a process 400 of error correcting Baudot transmission according to the present invention. The method employs a Baudot-capable error correcting transmitter such as the transmitter 100 of FIG. 1 and either a conventional receiver such as the receiver 200 of FIG. 2 or a Baudot-capable error correcting receiver such as the receiver 300 of FIG. 3. The process operates while signals from a user operated device such as a telephone or teletype are being received at a transmitter input.

At step 401, signals are received. At step 402, the signals are examined for the presence of Baudot code. If no Baudot code is detected, the process proceeds to step 403, the signals are speech encoded and channel encoded for transmission as ordinary speech and the process returns to step 401.

If Baudot code is detected, the process proceeds to step 404. At step 404, a Baudot decoding and character encoding operation is started with Baudot decoding of signals appearing at the input. At the same time, a selection is made to transmit as output the result of the Baudot decoding and character encoding operation. At this point in the Baudot decoding and character encoding operation, no Baudot characters have been generated, so silence is transmitted as the output.

The process then proceeds to step 406 and Baudot signals which have been encoded are stored in a buffer for later processing. Next, at step 407, the total number of characters in the buffer is compared to a predetermined threshold and the total time elapsed since the first character was stored is compared to a predetermined value. If the total number of characters in the buffer has reached the predetermined threshold or the time has elapsed since the first character was stored has reached the predetermined value, the process proceeds to step 408. Otherwise, the process returns to step 406.

At step 408, the stored characters are removed from storage and subjected to Baudot encoding. At the same time, the stored characters are packed.

At step 410, a message of the type "The next n frames will include the m Baudot characters ABC . . . " is generated, where n is the number of frames needed to transmit the contents of the buffer and m is the number of characters in the buffer. At step 412, a reverse CRC code, in which each bit of the normal CRC is toggled, is added to the message. The message is then encoded for transmission. Because each bit of the reverse CRC code is toggled, the message as encoded for transmission will appear as a bad frame packet according to the Baudot standard. At step 414, the Baudot characters which were retrieved from storage are subjected to Baudot encoding to produce a waveform representing the Baudot characters received from the character buffer. At step 416, the waveform is encoded and CRC code is added. At step 418, the encoded waveform is passed for transmission.

At step 420, new signals are received. At step 422, the signals are examined to determine if they contain Baudot coding. If the signals contain Baudot coding, the process returns to step 406 and the Baudot process continues. If the signals do not contain Baudot coding, the process proceeds to step 424 and the remaining buffered characters are processed. The process then returns to step 403.

If a signal transmitted according to the method 400 is received at a prior art receiver, the signal will appear as silence followed by a bad frame followed by a prior art Baudot signal, but the error correcting data in the signal will not be misinterpreted by the prior art receiver. Instead, the error-correcting data will simply be rejected as a bad frame, and the conventionally encoded Baudot signal will be received and interpreted.

When the input to the transmitter changes to normal speech, Baudot characters will cease to be received at the input to the transmitter. Encoding and storing of Baudot characters will stop and the stored characters will be removed from storage and processed, so that no remaining stored characters exist. When no stored characters remain for processing, encoding of Baudot characters will end. When no Baudot signals are being detected at the input, no stored Baudot characters remain, and no Baudot characters are waiting for encoding, the process proceeds to step 402. This is because all received Baudot signals have been processed and no new Baudot signals are being received. Normal speech is being received at the input and can be encoded for transmission.

Figure 5:
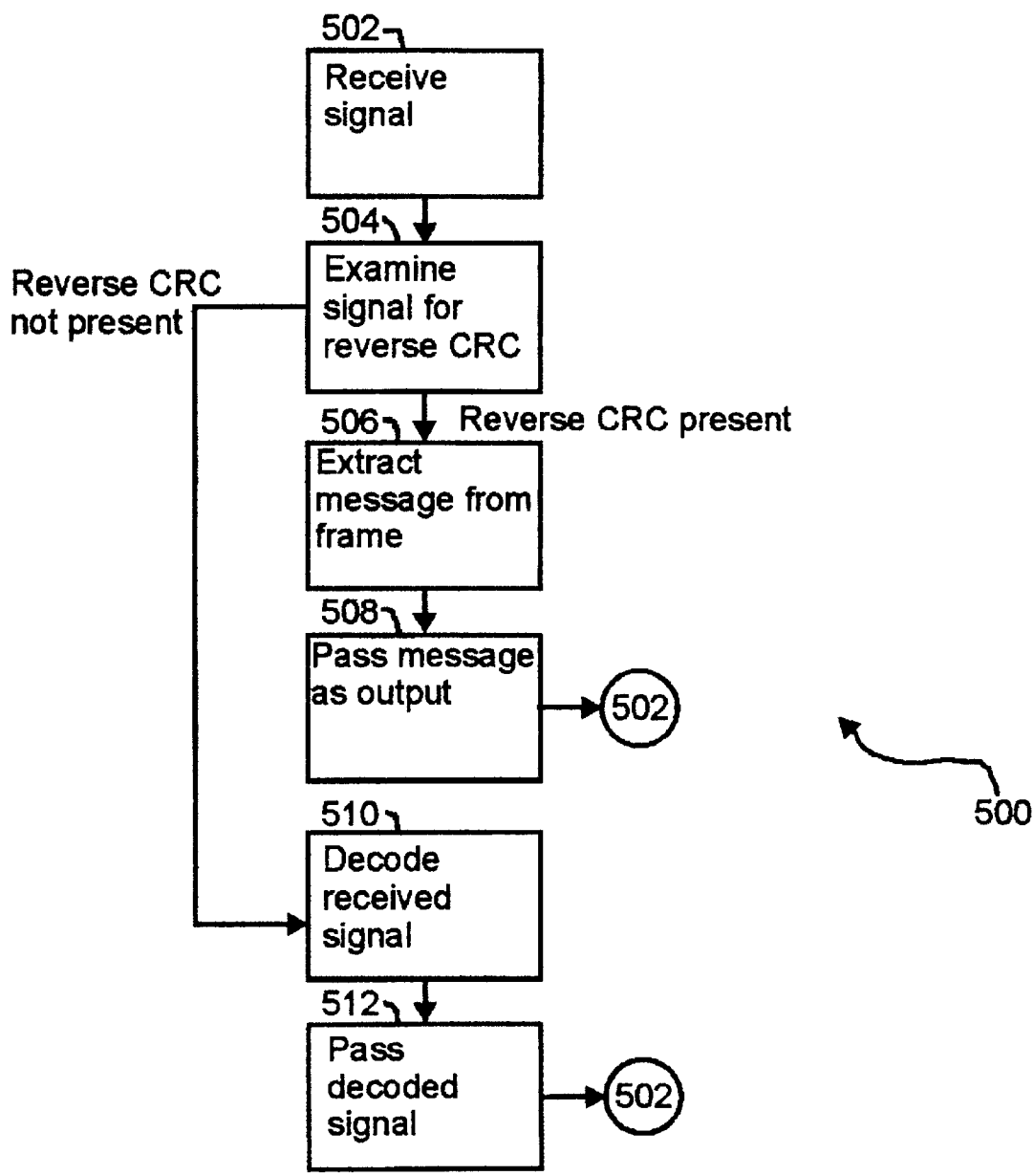
FIG. 5 illustrates a method of Baudot-capable error correcting reception according to the present invention.

FIG. 5 illustrates a process 500 of Baudot-capable error correcting reception according to the present invention. The process begins when connection has been established with a transmitter and signals are being received from the transmitter.

At step 502, a signal is received from a transmission channel and decoded. At step 504, the signal is examined for the presence of reverse CRC data. If reverse CRC data is present, a frame from a transmitter of the present invention has been detected and the process proceeds to step 506. At step 506, the message contained in the frame is extracted and the received character string is subjected to Baudot encoding to form a Baudot data signal for use in a user operated device. At step 508, the Baudot data signal is passed to the user operated device. The process then returns to step 502.

Referring back to step 504, if no reverse CRC data is present, the signal being received is not being generated by a transmitter according to the present invention. In that case, the process proceeds to step 510. At step 510, the received signal is decoded as ordinary speech according to conventional methods. At step 512, the decoded signal is passed as audio. The process then returns to step 502.

Figure 6:
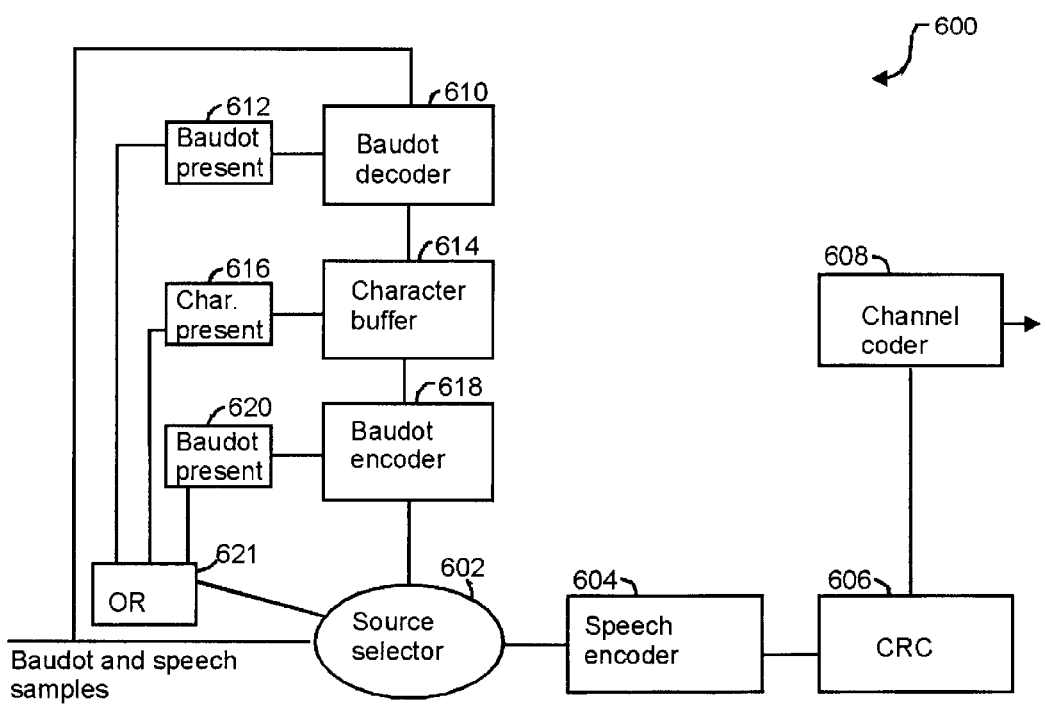
FIG. 6 illustrates a Baudot-capable error correcting transmitter according to another aspect of the present invention.

FIG. 6 illustrates a Baudot-capable error correcting transmitter 600 according to another aspect of the present invention. The transmitter 600 includes a source selector 602, a speech encoder 604, a CRC generator 606 and a channel coder 608. During operation of the transmitter 600, an input stream comprising speech and data samples is provided to the source selector 602. During normal speech, the source selector selects the speech samples as input to the speech encoder 604. The CRC generator 606 adds CRC code to the output of the speech encoder 604 to produce a speech frame, which is then passed to the channel coder 608 to be transmitted as output.

The Baudot and speech samples appearing at the input of the transmitter 600 are also passed to a Baudot decoder 610. When Baudot signals appear at the input of the transmitter 600, they are detected by the Baudot decoder 610, which sets a first Baudot present flag 612. A Baudot decoder 610 then constructs a series of Baudot characters to represent Baudot data received at the input to the transmitter 600.

The transmitter 600 also includes a character buffer 614, which sets a character present flag 616 if characters are present in the buffer. The transmitter 600 further includes a Baudot encoder 618 which sets a second Baudot present flag 620 if the Baudot encoder 618 is receiving Baudot characters.

The states of the flags 612, 616 and 620 are fed to an OR gate 621, whose output is supplied as a control to the source selector 602. If any of the flags 612, 616 or 620 is set, the source selector 602 feeds the output of the Baudot encoder 618 into the speech encoder 604. When Baudot code first appears at the input to the transmitter 600, the first Baudot flag 612 is set, but at this point the Baudot encoder 618 has not received any characters. The Baudot encoder 618 therefore generates silence, which is fed to the speech encoder 604. As Baudot characters are received, they are decoded by the Baudot decoder 610 to produce a character stream, which is fed to the character buffer 614. The character buffer 614 holds the characters until one of the following two conditions is satisfied. Either the total number of characters reaches a threshold, or the time since the first character was received in the character buffer 614 reaches a threshold. Once one of these conditions occurs, the character buffer 614 transmits the characters to the Baudot encoder 618.

The threshold for transmitting characters may suitably be set depending on the error correction technique used. For example, if the Baudot encoder 618 sets the stop bit duration in order to set parity, the character buffer 614 may transmit characters as quickly as they come in, or in any other sequence desired. This is because each character carries error detection information which does not relate to any other character. On the other hand, if the Baudot decoder 610 assigns an error correction bit to each character, the character buffer 614 may suitably send characters in groups. For example, assigning one error correction bit per character allows for the correction of 1 bit in a group of 5 characters. Therefore, the character buffer may suitably set a threshold of 5 characters and transmit characters in groups of 5.

Each Baudot character constructed by the encoder 618 includes a start bit, a series of 5 data bits, and a stop bit. The Baudot standard allows the duration of the stop bit to be of any length from 22 to 44 milliseconds. The Baudot encoder 618 may be designed to implement a parity control by setting the duration of the stop bit, for example, a short stop bit may indicate even parity while a long stop bit indicates an odd parity. If a more elaborate error correction technique is desired, the Baudot encoder 618 may be designed to add one error correction bit to each stop bit. In this case, characters would be grouped in blocks of m characters and the stop bit of each character in the block would represent a 1 if it is a long stop bit or a 0 of it is a short stop bit. Since each Baudot character contains 5 bits, the block contains 5 * m data bits and m error control bits. For example, if the value is chosen to be 5, the well known Hamming (31,26) code can be used. The Hamming code is capable of correcting up to 1 bit error in a block of 31 bits, of which 26 are data bits and 5 are error control bits. Including a long stop bit with each character would not result in any delays if all stop bits are extended from short to long, because even with a portion of the bandwidth devoted to error correction, the data capacity is much greater than human typing ability.

The waveform will then be passed to the speech encoder 604, which will encode the waveform and pass it to the CRC generator 606, which will add CRC code. The encoded waveform will then be passed to the channel coder 608 for transmission.

When no more Baudot characters are received at the Baudot decoder 610, the first Baudot present flag 612 will be cleared. When no more characters are present in the character buffer 614, the character present flag 616 will be cleared, and when no Baudot characters are present at the Baudot encoder 618, the second Baudot present flag 620 will be cleared. Thus, all three flags are cleared when the Baudot encoder 618 has finished processing all of the characters presented, the character buffer 614 is empty and the Baudot 610 decoder does not detect any more Baudot input. At that time, the source selector 602 selects the input to the transmitter 600 and passes it to the speech encoder 604.

If a prior-art receiver such as the receiver 200 of FIG. 2 receives a Baudot transmission from the transmitter 600, the stop bits will simply be interpreted as ordinary stop bits regardless of their length, and no errors will be introduced by misinterpretation of error correction data. However, a receiver implementing error correction features according to the present invention will be able to use the error correction data to detect and correct errors.

Figure 7:
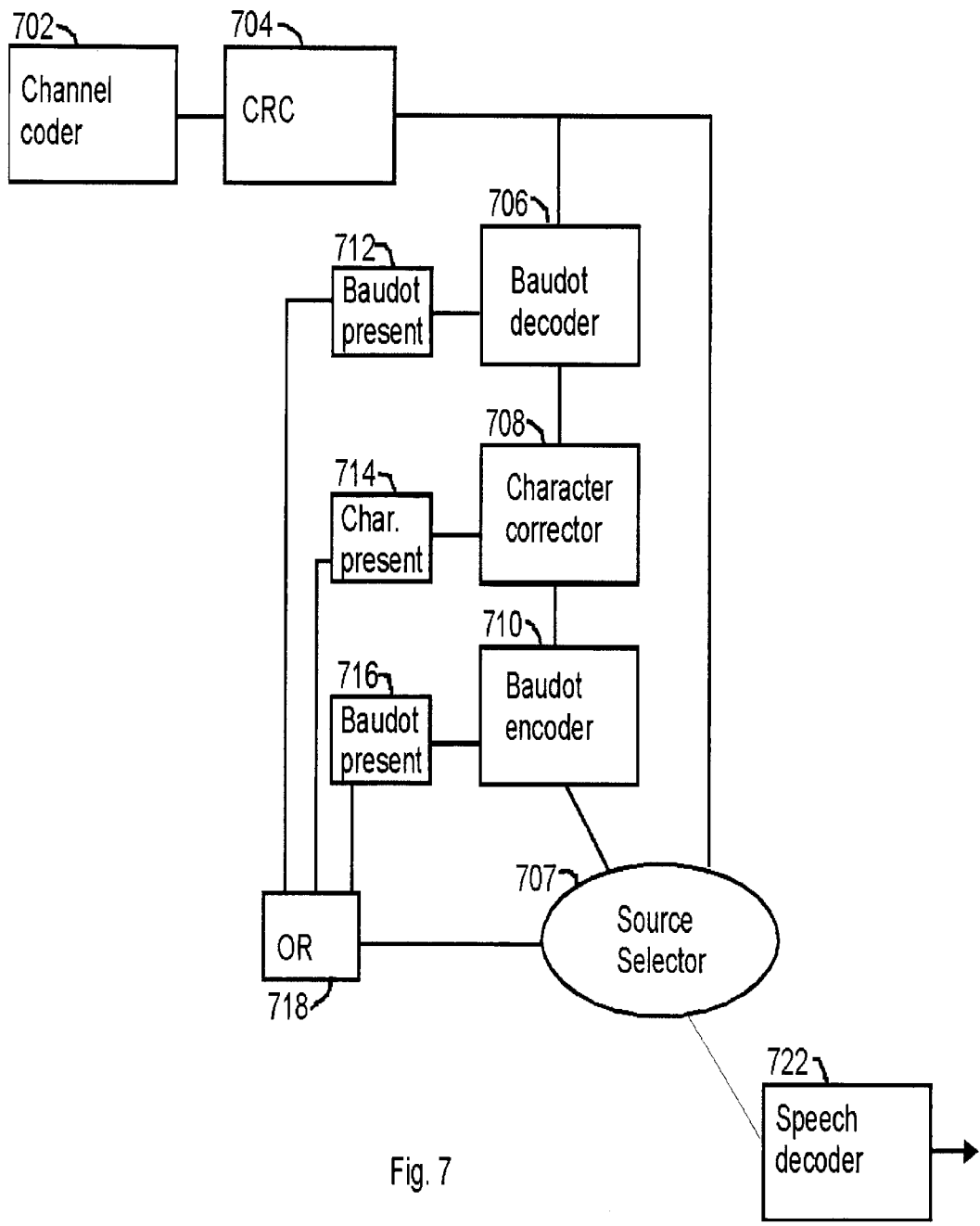
FIG. 7 illustrates a Baudot-capable error correcting receiver according to another aspect of the present invention.

FIG. 7 illustrates an error correcting receiver 700 according to the present invention. The receiver 700 is adapted to correctly interpret Baudot characters having error correction information included in stop bits according to the present invention. The receiver 700 includes a channel decoder 702, and a CRC decoder 704. The CRC decoder receives a speech frame from the channel coder 702 and examines the frame for correct CRC data. If the CRC data is incorrect, the frame is rejected as a bad frame. If the CRC data is correct, the frame is accepted for processing.

The CRC decoder 704 passes the frame to a Baudot decoder 706 and to a source selector 707. When Baudot signals appear at the input of the receiver 700, they are detected by the Baudot decoder 706, which sets a first Baudot present flag 712. The receiver 700 also includes a character corrector 708, which sets a character present flag 714 if characters are present in the character corrector 708. The receiver 700 further includes a Baudot encoder 710 which sets a second Baudot present flag 716 if the Baudot encoder 710 is receiving Baudot signals.

The states of the flags 712, 714 and 716 are fed to an OR gate 718, whose output is supplied as a control to the source selector 707. If any of the flags 712, 714 or 716 is set, the source selector 707 feeds the output of the Baudot encoder 710 into a speech decoder 722. When Baudot code first appears at the Baudot decoder 706, the first Baudot flag 712 is set, but at this point the Baudot encoder 710 has not received any characters. The Baudot encoder 710 therefore generates silence, which is fed to the speech decoder 722. As Baudot characters are received, they are decoded by the Baudot decoder 706 to produce a character stream, which is fed to the character corrector 708.

If the character corrector 708 is designed to employ stop bit information to perform error correction, characters are collected into blocks as they are received from the Baudot decoder 706. Each block will typically comprise a number of characters transmitted by a compatible receiver encoding error correction information in stop bits according to the present invention. For example, as noted above, the transmitter 600 of FIG. 6 may suitably transmit characters in blocks of 5, in order to provide the ability to correct one bit in each block of 5 characters. Thus, in a receiver 700 designed to communicate with a transmitter such as the transmitter 600, the character corrector 708 would assemble incoming characters into blocks of 5.

Once the character corrector 708 has received a block of characters, it examines the error correction data contained in the stop bits. If a 1-bit error exists, the character corrector 708 identifies the correct characters and then constructs a sequence of characters consisting of the corrected character and all following characters. The character corrector 708 then outputs the corrected block of characters to the Baudot encoder 710, which constructs a waveform based on the characters received from the character corrector 708. The Baudot encoder 710 supplies the waveform to the speech decoder 722, which processes the waveform and passes it to a user operated device.

If the receiver 700 is designed to recognize parity errors, the character corrector 708 will interpret a short stop bit as an even parity and a long stop bit as an odd parity. If a parity error is detected, parity information will not by itself indicate how to correct the error. However, most transmission errors in wireless Baudot signaling result from frame errors. Therefore, if the character corrector 708 identifies a parity error, the character corrector 708 will toggle the bit which was received during the frame containing the parity error. In this design, the character corrector 708 may output each character as it is analyzed and error corrections are made.

When no more Baudot characters are received at Baudot decoder 706, the first Baudot present flag 712 will be cleared. When no more characters are present in the character corrector 708, the character present flag 714 will be cleared, and when no Baudot characters are present at the Baudot encoder 710, the second Baudot present flag 716 will be cleared. Thus, all three flags are cleared when the Baudot encoder 710 has finished processing all of the characters presented, the character corrector 708 has no characters and the Baudot decoder 706 does not detect any more Baudot input. At that time, the source selector 720 selects the output of the CRC decoder 704 and passes it to the speech decoder 722.

Figure 8:
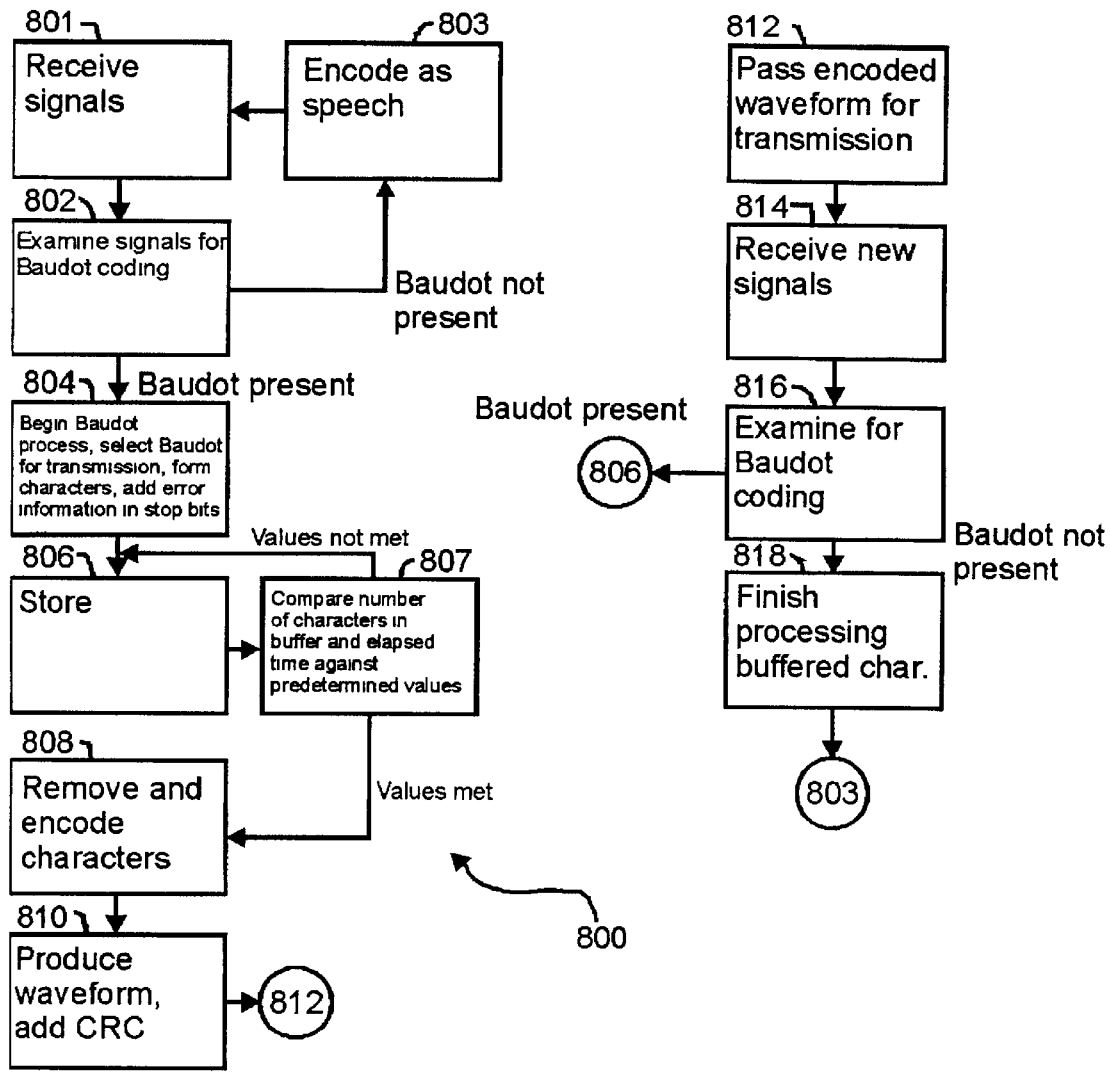
FIG. 8 illustrates a method of Baudot-capable transmission employing stop bit information for error correction according to the present invention.

FIG. 8 illustrates a process 800 of error correcting Baudot transmission according to the present invention. The method employs a Baudot-capable error correcting transmitter such as the transmitter 600 of FIG. 6 and either a conventional receiver such as the receiver 200 of FIG. 2 or a Baudot-capable error correcting receiver such as the receiver 700 of FIG. 7. The process operates while signals from a user operated device such as a telephone or teletype are being received at a transmitter input.

At step 801, signals are received. At step 802, the signals are examined for the presence of Baudot code. If no Baudot code is detected, the process proceeds to step 803, the signals are speech encoded and channel encoded for transmission as ordinary speech and the process returns to step 801.

If Baudot code is detected, the process proceeds to step 804. At step 804, a Baudot decoding and character encoding operation is started with Baudot decoding of signals appearing at the input. Incoming Baudot signals are decoded and Baudot characters are constructed. As each Baudot character is constructed, error detection and correction information is stored in the stop bit of the character. The stop bit information may be used to store parity information, with a short stop bit used to represent even parity and a long stop bit used to represent odd parity. Alternatively, the stop bit may be used to store information used to both detect and correct errors, with the stored stop bit information being available to provide correction for a block of characters.

At the same time, a selection is made to transmit as output the result of the Baudot decoding and character encoding operation. At this point in the Baudot decoding and character encoding operation, no Baudot characters have been generated, so silence is transmitted as the output.

The process then proceeds to step 806 and Baudot characters which have been decoded are stored in a buffer for later processing. Next, at step 807, the total number of characters in the buffer is compared to a predetermined threshold and the total time elapsed since the first character was stored is compared to a predetermined value. The predetermined threshold may be set to "1" if the stop bit information is chosen to represent odd or even parity, because the characters can be output as quickly as they are constructed. If correction information is included in the stop bits, the predetermined threshold is set so as to organize the characters into blocks, such as a block of 5 characters in which the stop bit information can provide 1 bit of error correction.

If the total number of characters in the buffer has reached the predetermined threshold or the time that has elapsed since the first character was stored has reached the predetermined value, the process proceeds to step 808. Otherwise, the process returns to step 806.

At step 808, the stored characters are removed from storage and subjected to Baudot encoding to produce a waveform representing the Baudot characters received from the character buffer. At step 810, the waveform is encoded and CRC code is added. At step 812, the encoded waveform is passed for transmission.

At step 814, new signals are received. At step 816, the signals are examined to determine if they contain Baudot coding. If the signals contain Baudot coding, the process returns to step 806 and the Baudot process continues. If the signals do not contain Baudot coding, the process proceeds to step 818 and the remaining buffered characters are processed. The process then returns to step 803.

If a signal transmitted according to the method 800 of FIG. 8 is received at a prior-art Baudot-capable receiver, the stop bits will appear as ordinary stop bits and the error correcting data in the signal will not be misinterpreted by the prior-art receiver.

When the input to the transmitter changes to normal speech, Baudot characters will cease to be received at the input to the transmitter. Encoding and storing of Baudot characters will stop and the stored characters will be removed from storage and processed, so that no remaining stored characters exist. When no stored characters remain for processing, encoding of Baudot characters will end. When no Baudot signals are being detected at the input, no stored Baudot characters remain, and no Baudot characters are waiting for encoding, the process proceeds to step 802. This cycling occurs because all received Baudot signals have been processed and no new Baudot signals are being received. Normal speech is being received at the input and can be encoded for transmission.

Figure 9:
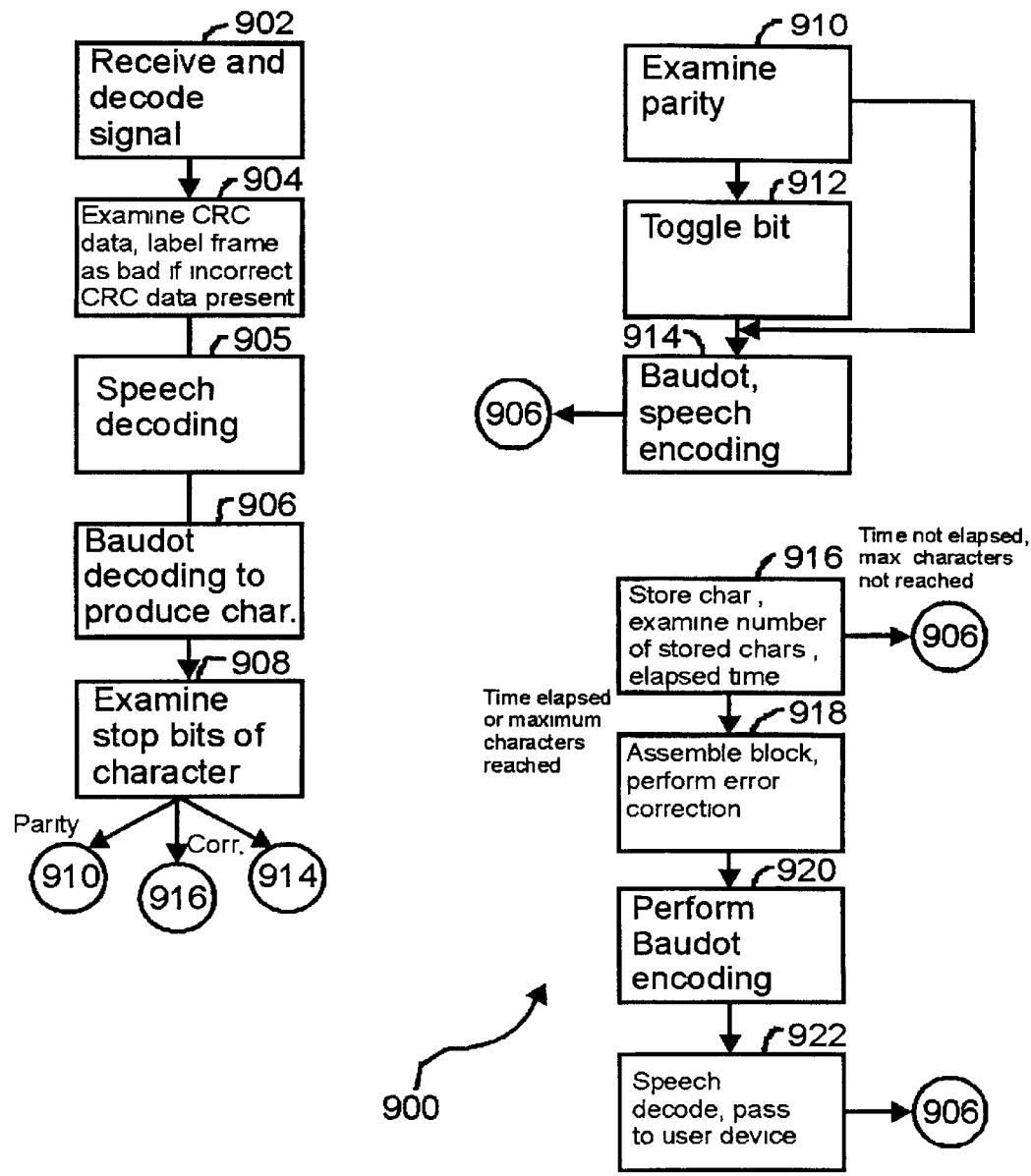
FIG. 9 illustrates a method of Baudot-capable reception employing stop bit information for error correction according to the present invention.

FIG. 9 illustrates a process 900 of Baudot-capable error correcting reception according to the present invention. The process begins when connection has been established with a transmitter and signals are being received from the transmitter.

At step 902, a signal is received from a transmission channel and decoded. At step 904, the signal is examined for correct CRC data. If incorrect CRC data is present, the signal is labeled as a bad frame. The process then continues to step 905 and the data is decoded by a speech decoder to produce an audio signal. The process proceeds to step 906 and the signal is subjected to Baudot decoding to produce a Baudot character. The process proceeds to step 908 and a Baudot character is subjected to error detection and correction by examining the stop bits of each character. If a Baudot character has parity information contained in the stop bits, the process proceeds to step 910 and the parity is examined to determine if it is correct. If the parity is not correct, the process proceeds to step 912 and the bit represented by a bad frame is toggled. The process then proceeds to step 914 and the character is subjected to Baudot encoding and passed to a user operated device. If the parity information is correct, step 912 is skipped and the process proceeds to step 914. After step 914, the process returns to step 906.

Referring back to step 908, if a Baudot character has error correction and detection information included in its stop bits, the process proceeds to step 916 and the character is stored and the number of stored characters and the time since storage of the first character are examined. If a predetermined number of characters has been reached or a predetermined time has elapsed since storage of the first character, the process proceeds to step 918 and the stored characters are assembled into a block and error correction is performed on the block of characters. The process then proceeds to step 920 and the characters are subjected to Baudot encoding. The process then proceeds to step 922 and the characters are subjected to speech decoding and passed to a user operated device. The process then returns to step 906.

Referring back to step 916, if a predetermined number of characters has not been reached and a predetermined time has not elapsed, the process returns to step 906.

In order to avoid erroneously applying error correction to transmissions generated by prior art Baudot transmitters, actual error correction may be disabled until a few characters have been received in which the parity or error correction information indicates that those characters were received correctly.

Referring back to step 908, if the character does not contain error detection and correction information contained in the stop bits, the process proceeds to step 914 and the character is subjected to Baudot encoding and speech decoding and passed to a user operated device. The process then returns to step 906.

While the present invention is disclosed in the context of a presently preferred embodiment, it will be recognized that a wide variety of implementations may be employed by persons of ordinary skill in the art consistent with the above discussion and the claims which follow below.

I claim:

1. An error-correcting Baudot transmitter comprising:
   a user interface for receiving a user input;
   a message generator operative to examine the input for the presence of Baudot signals and, if the input comprises Baudot signals, to generate a message frame comprising a message describing the format and content of the input, the message frame being given a format corresponding to a bad frame packet; and
   a Baudot encoder for producing a stream of Baudot signals corresponding to the user input, the stream of Baudot signals following the message frame.

2. The transmitter of claim 1 wherein the message generator comprises a Baudot decoder to produce a stream of Baudot characters and a character buffer to hold the Baudot characters, and wherein the message generator also comprises a character packer operative to receive the buffered Baudot characters to form the message, the message generator also comprises a reverse cyclic redundancy code generator for producing a reverse cyclic redundancy code and applying the reverse cyclic redundancy code to the message.

3. The transmitter of claim 2 and also including a source selector which selects the input to the transmitter for direct transmission while no Baudot signals are present or being processed, and which selects the Baudot encoder output for transmission during the presence or processing of Baudot signals.

4. A Baudot-capable error correcting receiver comprising:
   a signal interface for receiving a signal from a transmitter;
   a message extractor for detecting a message containing Baudot information contained in the signal and formatted as a bad frame packet and containing format and content information defining the content of the message; and
   a decoder for decoding the message to produce output for a user-operated device.

5. The receiver of claim 4 wherein the message extractor includes a reverse cyclic redundancy code detector for detecting a reverse cyclic redundancy code attached to the message and a character unpacker for unpacking Baudot characters contained within the message.

6. The receiver of claim 5 wherein the receiver is operative to detect and decode conventional Baudot signals appearing at the signal interface and to pass the decoded signals to a user device.

7. The receiver of claim 6 and also including a source selector operative to pass the Baudot signals extracted from the message to the user device if Baudot signals are present as part of the message, the source selector being operative to pass conventional Baudot signals or speech to the user device if no Baudot signals are present as part of the message.

8. An error-correcting Baudot communication system, comprising:
   a transmitter operative to receive a user input comprising Baudot characters and interpret the user input to format a message describing the format and content of the user input, the message being formatted as a bad frame packet; and
   a receiver operative to receive a transmission comprising a message formatted as a bad frame packet and interpret the message to extract Baudot character information contained in the message, the receiver being further operative to decode the Baudot character information and supply the Baudot character information to a user-operated device.

9. The communication system of claim 8, wherein the transmitter is also operative to produce a Baudot character stream representing the user input and to transmit the Baudot character stream following transmission of the message.

10. The communication system of claim 9, wherein the receiver is also operative to receive and decode a Baudot character stream and provide the decoded Baudot character stream to a user-operated device.

11. The communication system of claim 10, wherein the transmitter is operative to distinguish between a user input consisting of Baudot signals and a user input consisting of voice signals and to directly encode the user input for transmission if the user input consists of voice signals.

12. A method of error-correcting Baudot communication comprising the steps of:
    receiving an input from a user;
    creating a message describing the format and content of the user input;
    formatting the message as a bad Baudot frame; and
    transmitting the message.

13. The method of claim 12 wherein the step of creating the message is followed by a step of encoding the input to form a stream of Baudot characters and wherein the step of transmitting the message is followed by a step of transmitting the stream of Baudot characters.

14. The method of claim 13 wherein the step of formatting the message as a bad Baudot frame includes adding a reverse cyclic redundancy code to the message.

15. A method of error-correcting Baudot reception, comprising the steps of:
    receiving a transmission;
    analyzing the transmission to determine if the transmission contains a message formatted as a bad Baudot frame;
    if the message contains a bad Baudot frame, extracting and decoding the message and passing Baudot characters represented by the message to a user device; and
    detecting conventionally encoded signals in the message, decoding the signals, and passing the decoded signals to the user device.

16. An error-correcting Baudot transmitter comprising:
    a user interface for receiving a user input;

a Baudot decoder operative to examine the input for the presence of Baudot signals and, if the input comprises Baudot signals, to generate Baudot characters representing the Baudot signals, each character containing error data encoded in a stop bit of the character; and a Baudot encoder for producing a waveform representing the Baudot characters produced by the Baudot decoder.

17. The transmitter of claim 16 wherein the Baudot encoder is operative to assign a long or short stop bit to a character depending on the parity of the character.

18. The transmitter of claim 16 further comprising a character buffer, wherein the Baudot encoder is operative to add error correction and detection data to stop bits of each character forming a block of characters, the error correction and detection data being adapted to provide error correction and detection capability for the block of data and wherein the character buffer being operative to assemble the characters into the block.

19. A Baudot-capable error correcting receiver comprising:

a signal interface for receiving a signal from a transmitter;

a Baudot decoder for decoding the signal to form Baudot characters a character corrector operative to examine each character to identify error detection and correction information contained in a stop bit of each character and to perform error correction based on the error detection and correction information to produce corrected characters; and a Baudot encoder for encoding the corrected characters to create a waveform based on the corrected characters.

20. The receiver of claim 19 wherein the character corrector is operative to examine the stop bit of each character to determine if the stop bit indicates correct parity for each character and to toggle a bit represented by a bad frame packet.

21. The receiver of claim 20 wherein the character corrector is operative to assemble characters into blocks and perform error correction and detection on each block based on error detection and correction information represented by the stop bits of the characters comprising each block.

22. An error-correcting Baudot communication system, comprising:

a transmitter operative to receive a user input representing Baudot characters and interpret the user input to form error correcting Baudot characters having error correction and detection information in a stop bit of each Baudot character, the transmitter being further operative to encode the error correcting Baudot characters to create a waveform for transmission; and a receiver operative to receive a transmission comprising a waveform representing error corrected Baudot characters and decode the waveform to create Baudot characters, the receiver being operative to use the error correction and detection information contained within the stop bits of the Baudot characters to identify and correct errors introduced during transmission of the waveform to created corrected Baudot characters, the receiver being operative to supply the corrected Baudot characters to a user operated device.

23. A method of error-correcting Baudot communication comprising the steps of:

receiving an input from a user;

decoding the input to form a stream of error correcting Baudot characters, each of the Baudot characters including error correction and detection information in a stop bit of the Baudot character creating a waveform representing the error correcting Baudot characters; and transmitting the waveform.

24. The method of claim 23 wherein the error correction and detection information includes parity information.

25. A method of error-correcting Baudot reception, comprising the steps of:

receiving a transmission;

decoding the transmission to form a stream of Baudot characters;

analyzing each Baudot character for error correction and information contained in a stop bit of the character;

if a Baudot character contains error correction and information in the stop bit of the Baudot character, performing error detection and correction based on the error correction and detection information;

encoding the stream of Baudot characters to create a waveform representing the Baudot characters; and providing the waveform to a user operated device.

* * * * *